United States Patent [19]
Jan

[11] Patent Number: 5,363,097
[45] Date of Patent: Nov. 8, 1994

[54] DIRECT SEQUENTIAL-BIT VARIABLE LENGTH DECODER

[75] Inventor: Yung-Jung Jan, Keelung, Taiwan, Prov. of China

[73] Assignee: Industrial Technology Research Institute, Hsinchu, Taiwan, Prov. of China

[21] Appl. No.: 944,657

[22] Filed: Sep. 14, 1992

[51] Int. Cl.$^5$ .............................................. H03M 7/40
[52] U.S. Cl. ........................................ 341/67; 341/63
[58] Field of Search ................... 341/63, 67, 65, 64, 341/106

[56] References Cited

U.S. PATENT DOCUMENTS

| | | | |
|---|---|---|---|
| 4,420,771 | 12/1983 | Pirsch | 341/67 |
| 4,813,056 | 3/1989 | Fedele | 341/107 |
| 4,827,336 | 5/1989 | Acampora et al. | 358/135 |
| 5,060,242 | 10/1991 | Arbeiter | 341/67 |
| 5,138,315 | 8/1992 | LeQueau et al. | 341/67 |
| 5,220,325 | 6/1993 | Ackland et al. | 341/67 |
| 5,223,348 | 8/1993 | Pollman et al. | 341/67 |
| 5,225,832 | 7/1993 | Wang et al. | 341/67 |

*Primary Examiner*—Howard L. Williams
*Attorney, Agent, or Firm*—Bo-In Lin

[57] ABSTRACT

The present invention comprises a high definition television (HDTV) receiver receiving a plurality of video data for display. The HDTV receiver comprises a VLD to first decode each of the video data into a fix-length data. The HDTV receiver further comprises a plurality of data memory banks for storing in parallel the fix-length data, and a plurality of run-length decoders (RLDs) to process in parallel the fix-length video data from the memory banks.

6 Claims, 5 Drawing Sheets

DIRECT SEQUENTIAL-BIT VARIABLE LENGTH DECODER

BACKGROUND OF THE INVENTION

1. Field of the Invention

This invention relates generally to the encoding/decoding data processing systems. More particularly, this invention relates to the architecture of a data encoding/decoding system wherein the variable-length decoder, run-length decoder, and data buffer are arranged in special order to achieve high process through-put rate.

2. Description of the Prior Art

The speed of a real-time data process such as a variable-length decoding process may often limit the through-put of the entire data handling system. In the past decade, the advances made in electronics, computer and data communication generate a tremendous need to transmit a large amount of data at very high speed and to store them in the memory storage apparatus. In order to satisfy these needs, a data item which is represented by a bit-stream is first compressed before transmission and storage. A code-word with less number of bits is used to encode the original bit-stream whereby the data transmission time can be shortened and the encoded data can be stored in less memory space than that required by the data as represented by the bit-stream in its original form.

Among several data compression techniques, a variable-length encoding wherein the code words are allowed to have variable number of bits is frequently chosen because it generally can achieve higher encoding efficiency than the fix-length encoding methods. On the other hand, for the purpose of receiving data, a data receiver in receiving these encoded data items must first perform a decoding process in order to properly recognize and then use these data. In performing a decoding operation on a plurality of encoded data items each having a variable length, the decoding operation is more time consuming in most cases than a decoding operation applied to the fix-length encoded data since there is no prior knowledge for determining how many of the encoded bits must be processed in order to generate a decoded bit-stream.

Another commonly used technique to increase the data processing speed is by using a plurality of processors and by configuring these processors such that the data processing operations can be independently and simultaneously performed in parallel. For a fixed-length decoding, a bit-stream can be easily segmented into a plurality of sub-streams each with the predefined length; each sub-stream can then be processed in parallel with a multi-processor decoding system. The parallel processing technique is, however, not applicable to variable-length decoding because the number of bits in the incoming bit-stream to be processed in order to decode a word is unknown; each incoming bit must be serially processed until a code-word is found. Therefore, if the speed of a variable decoding process limits the over-all system through-put, the technique of parallel processing is not available to overcome this system limitation.

One specific example wherein the variable-length decoding may limit the system through-put is a digital HDTV. For the purpose of explanation, the compression process performed by a digital video encoder 10 as shown in FIG. 1 is first described. The analog red, green and blue (R, G, B) inputs are processed by three low pass filters (LPFs) 12-1, 12-2 and 12-3 before they are digitized. The low pass filters 12-1, 12-2 and 12-3 are used to provide adequate rejection of aliasing components and other spurious signals. The analog to digital converters (A/Ds) 14-1, 14-2, and 14-3 then digitized the signals before the RGB signals are digitally converted to YUV color space by utilizing a RGB to YUV Matrix 16 which conforms to the SMPTE 240M colorimetry.

The resolution of chrominance data can be reduced relative to the luminance resolution without seriously affecting the perceived image quality. The U and V chrominance components are decimated horizontally by a factor of four and vertically by a factor of two by two decimators 18-1 and 18-2. The luminance signal (Y) bypasses the chrominance preprocessor whereby full resolution is maintained. The chrominance components are then multiplexed with the luminance component, one block at a time, in a multiplexer 20.

Each block of pixels which generally comprises eight pixels horizontally and eight pixels vertically are then transformed into a new block of Discrete Cosine Transform (DCT) coefficients by a DCT transformer 22. The block size of eight-by-eight is chosen because the efficiency of transformation is not substantially improved with increased block size which often requires greater degree of circuit complexity when the block size is larger than eight-by-eight. The transformation is applied to each block until the the entire image is transformed.

In order to improve the coding efficiency, a small adjustment is made to each of the image data by first weighting each of the DCT coefficients and than selecting an eight bit weighting factor for transmission to the decoder. Once selected, the weighting factors remain unchanged. This task is performed by a coefficient quantizer 24 which utilizes an eight-by-eight weighting matrix wherein each matrix element is a scaling factor. The compressibility of the image data is improved through the quantization process where the amplitude of the transform coefficients are reduced. A statistical encoding technique is then applied to compress these image data. A Huffman coding is used by a variable-length encoder 28. In order to apply the Huffman coding, the eight-by-eight DCT coefficients are serialized into a sequence of sixty-four and "amplitude/run-length" code. Scanning the sequence of sixty-four, an event is defined to occur each time a coefficient is encountered with an amplitude not equal to zero. A code word is then assigned indicating the amplitude of the coefficient and the number of zeros, i.e., the run-length, preceding it.

The aforementioned compressions are spatial processing. In addition to the spatial correlations, the image data also have interframe temporal correlations which can be utilized to further compress the video signals. A high degree of temporal correlation exists whenever there is little movement from one frame to the next. Even if there is movement, high temporal correlation may still exist depending on the spatial characteristics and the changes of the images from one frame to the next. In order to quantify the interframe temporal correlation, the quantized data from the quantizer 24 is normalized in a normalization processor 32 and then inversely transformed by an inverse DCT transformer 34. The frame delay is taken into account by a frame delay processor 36. A prediction of how the next frame will appear is made by a motion estimator 38 and a motion compensation component is computed by the motion compensator 40. A temporal differential encoding (DPCM) is used to generate a motion vector of a superblock which has a horizontal dimension of four DCT blocks and a vertical dimension of two DCT blocks. The sizing is compatible with the four times horizontal sub-sampling and two times vertical sub-sampling of the chrominance components, thus allowing the same motion vector to be used to displace a single chrominance DCT block.

The motion compensation scheme is therefore integrated into the overall system design as that shown in FIG. 1 wherein an estimate of the image is first generated using the motion compensation. The difference between this estimate and the actual image is then transform-coded and the transform coefficients are then normalized and statistically coded by applying the Huffman coding process. A first-in-first-out (FIFO) buffer 44 is implemented as a rate buffer which matches the variable rate of the Huffman-coded data to a fixed output rate to maintain constant channel transmission. The FIFO buffer has sufficient storage space to accommodate input data rate variations. The status of the FIFO buffer is continuously monitored and controlled to prevent the buffer from overflow or underflow.

FIG. 2 shows the block diagram of a digital video decoder 50 for a digital HDTV. The sequence of operations of the decoder 50 is exactly in reverse order as that of the encoder 10 as shown in FIG. 1. The video data are first received by a FIFO rate buffer which is then decoded by a variable-length decoder 54. The decoded data are then inversely normalized (step 56) and inversely DCT transformed (step 58) before adjustments for motion compensation components are subtracted (steps 60 and 62). The video signals are then de-multiplexed by the demultiplexer 64 into YUV components where the U and V components are interpolated by two interpolators 66 and 68 before the YUV signals are converted to RGB space through a YUV to RGB matrix 70. A digital to analog conversion is performed by DAC 72 and then further processed by three low pass filters, i.e., LPFs 74, 76 and 78 before the analog RGB signals are displayed.

Because the video data received by the FIFO buffer 52 are compressed data and since the video data are transmitted via constant bit rate channels, the FIFO buffer 52, as implemented in the decoding system 50, has an advantage that the memory space of the buffer 50 can be maintained at a relatively low level. Additionally, under the current JPEG, MPEG, OR H.261 standards, the luminance and chrominanace pixel rates are less than 10 MHz. Such pixel rate can be satisfied by the decoder system 50 since a variable-length decoder with a decoding rate of twenty to twenty-five MHz are commercially available on a VLD chip. The through-put of the decoding system 50 is sufficient to support the current digital image compression systems.

In a digital HDTV system, much higher pixel rates are required. A standard resolution of 960-vertical-pixels by 1440-horizontal-pixels are displayed at a rate of thirty frames per second. The rate of chrominance is approximately half of the rate of the luminance pixels. A pixel rate of more than sixty million pixels per second is required. The system clock rate has to be about seventy MHz (70 MHz) in order to handle the pixel rate and to manage additional overhead in decoding and transmitting the appropriate control signals. A decoding system such as the decoder system 50 is not able to meet this requirement since the highest processing rate achievable by the current VLD is still below thirty MHz. The processing speed of the variable-length decoder 54 thus limits the through-put of the decoding system 50.

FIG. 3 illustrates the bit-rate requirements of the digital HDTV system. The incoming video data are received by the data buffer at a constant rate of 20M bits/second. The video data are then processed by the VLD 54 and a run-length decoder (RLD) 55. The speed of the VLD process is driven by the image pixel requirements which are 5 MHz when averaged over long periods of time, however, there are bursts of 70 MHz in order to satisfy the pixel rate for image display. The speed of the VLD 54 thus becomes a bottle neck limiting the performance of the entire decoding system.

Therefore, a need still exists in the art to overcome the through-put limitation when a slower, variable-length decoding process is involved whereby the performance of the entire encoding/decoding system can be improved. Specifically, in the art of digital HDTV, the difficulty caused by the speed of the variable-length decoding has to be resolved in order for the high quality HDTV images to be displayed at the designed rates and resolutions.

SUMMARY OF THE PRESENT INVENTION

It is therefore an object of the present invention to provide a decoding system capable of achieving higher rate of through-put without being limited by the speed of the variable-length decoding process.

Another object of the present invention is to provide a high through-put decoding system utilizing currently available variable-length decoder without requiring extraordinary high performance and very expensive variable-length decoder.

Another object of the present invention is to provide a high through-put decoding system by simply rearranging the sequence of the present system whereby the system performance can be improved with minimal redesign effort and costs.

Another object of the present invention is to provide a high through-put decoding system wherein the variable-length encoded data are first decoded into fix-length data for subsequent parallel processing whereby the system performance can be improved without requiring the use of expensive high performance devices.

Briefly, in a preferred embodiment, the present invention comprises a high definition television (HDTV) receiver receiving a plurality of video data for display. The HDTV receiver comprises a VLD to first decode each of the video data into a fix-length data. The HDTV receiver further comprises a plurality of data memory banks for storing in parallel the fix-length data, and a plurality of run-length decoders (RLDs) to process in parallel the fix-length video data from the memory banks.

One advantage of the present invention is that it provides a decoding system capable of achieving higher rate of through-put without being limited by the speed of the variable-length decoding process.

Another advantage of the present invention is that it provides a high through-put decoding system utilizing currently available variable-length decoder without requiring extraordinary high performance and very expensive variable-length decoder.

Another advantage of the present invention is that it provides a high through-put decoding system by simply rearranging the sequence of the present system whereby the system performance can be improved with minimal redesign effort and costs.

Another advantage of the present invention is that it provides a high through-put decoding system wherein the variable-length encoded data are first decoded into fix-length data for subsequent parallel processing whereby the system performance can be improved without requiring the use of expensive high performance devices.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
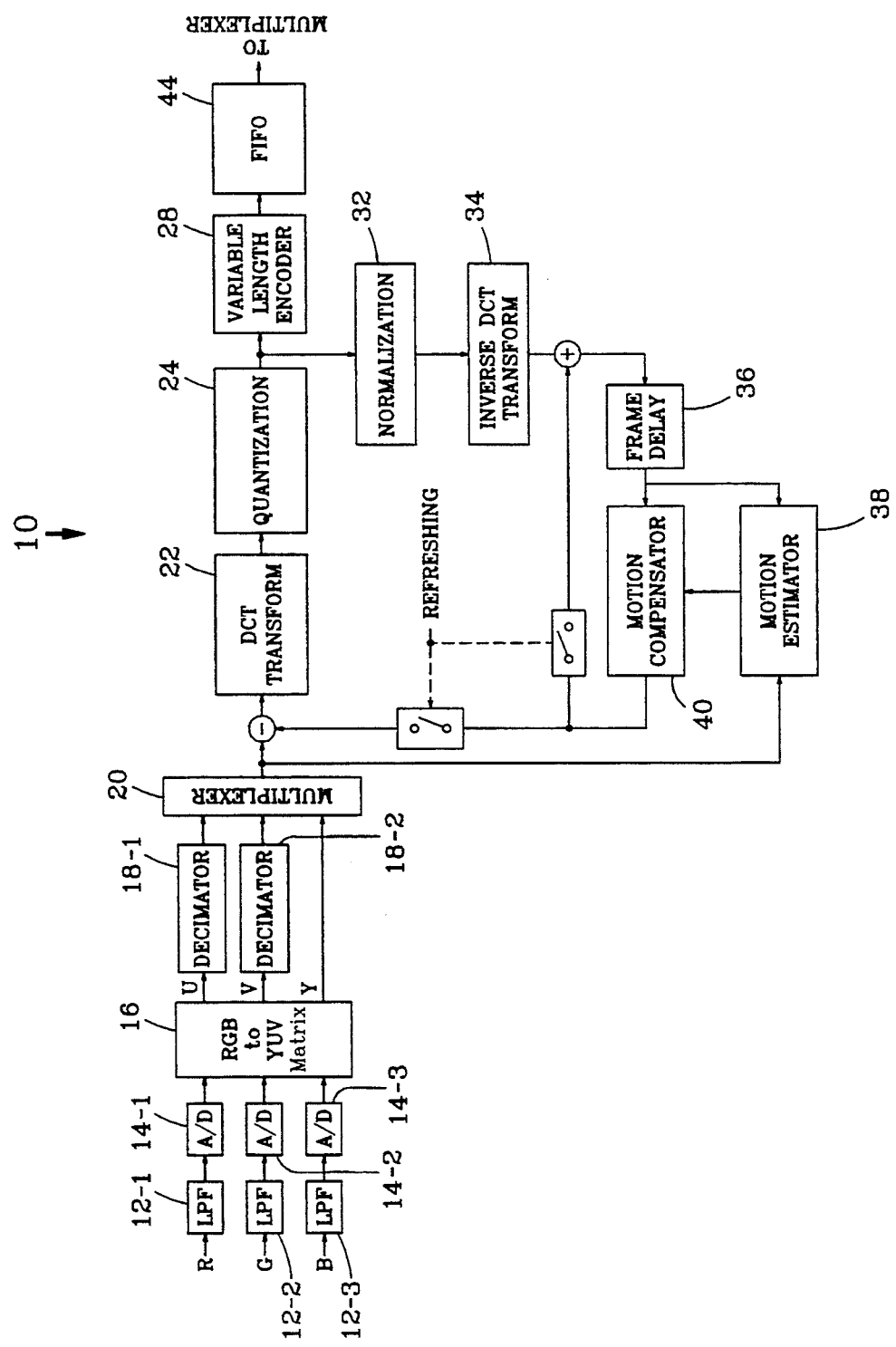
FIG. 1 is a block diagram showing the encoding processes of a digital HDTV transmitter.
Figure 2:
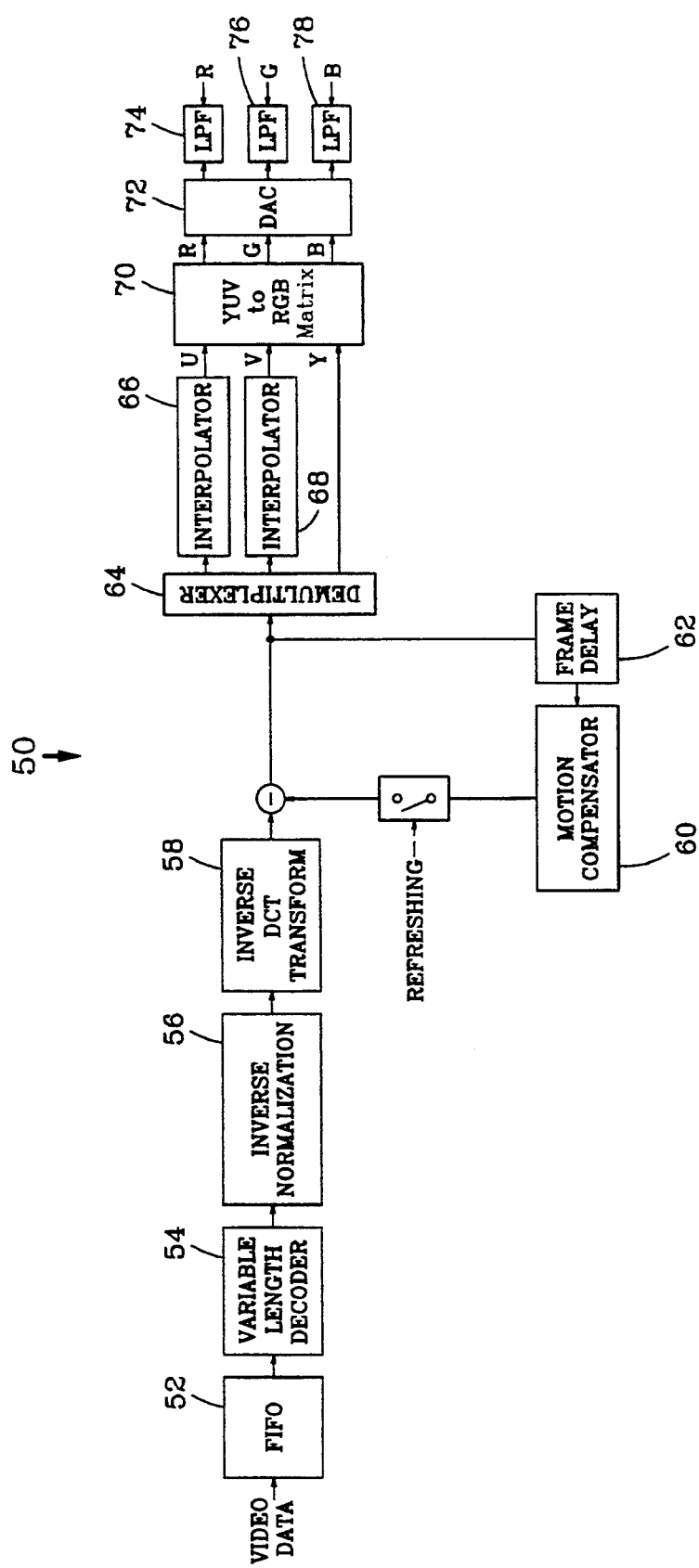
FIG. 2,is a block diagram showing the decoding processes of a digital HDTV receiver receiving the encoded data transmitted by the transmitter of FIG. 1.
Figure 3:
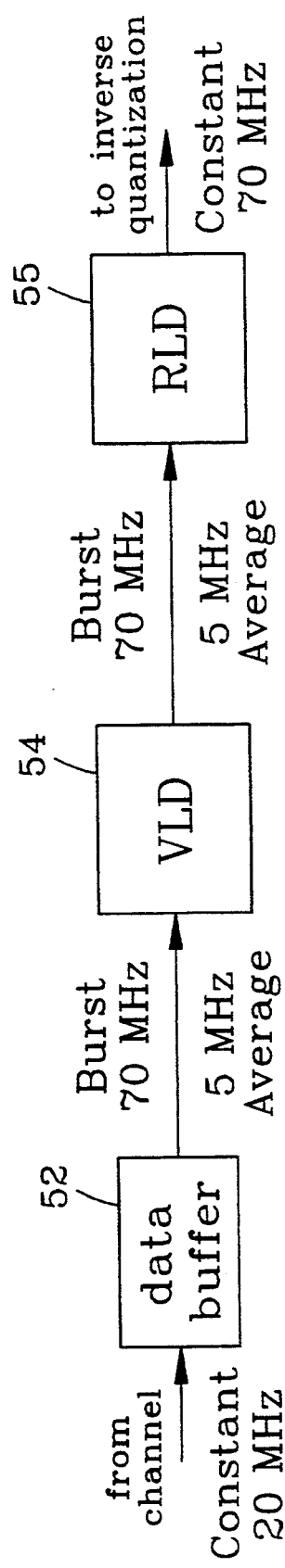
FIGS. 3 is a block diagram showing the data rate requirement of the buffer, the VLD and the RLD of the digital HDTV receiver of FIG. 2.
Figure 4:
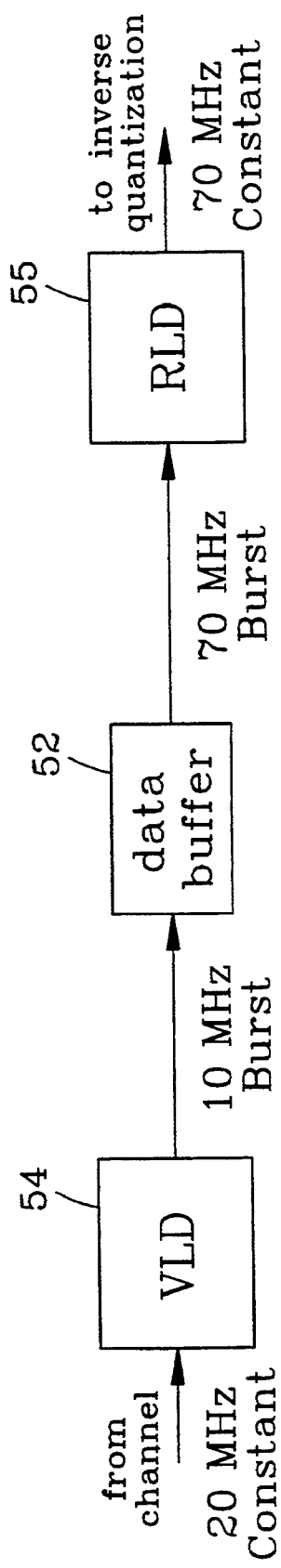
FIG. 4 is block diagram showing a rearranged sequence of a decoding system according to the present invention.

FIG. 4 is a block diagram showing the rearranged parts of the decoding system according to the present invention. The variable-length decoder (VLD) 54 is now rearranged to receive directly the incoming video data one bit per clock cycle at approximately 20 MHz clock rate in a serial manner. The clock rate of the VLD 54 is well within the achievable rate of the very large scale integration (VLSI) technology which is commercially available. The VLD 54 generally applies a Huffman decoding process which generate a fixed-length code word for input to the data buffer 52. The Huffman decode table is a binary tree which can be easily and economically implemented in a read-only-memory (ROM) based look-up table. Since the HDTV data format includes variable-length code and fixed-length code, the VLD 54 also has a data flow control which is capable of transmitting the fixed-length code directly to the data buffer 52 and to decode the variable-length words before the decoded fix-length words are transmitted to the data buffer 52.

The data buffer 52 is a two-port FIFO data buffer including a read port and a write port where the rates of read and write are controlled to assure that the amount of data stored in the buffer 52 is neither overflow nor underflow. Since the data buffer 52 now has to store the decoded data, the size of the buffer is two to three times larger than the buffer implemented in the prior art. However, since the buffer 52 is now used to store only the fix-length data, the memory space can be divided into several fix-length memory banks to reduced the required speed of these memory banks. For instance, to store the data of a super-block of sixteen pixels by sixteen pixels comprising four luminance blocks (eight pixels by eight pixels) and two chrominance blocks, the buffer is divided into six banks. A data rate of twelve MHz for each of the data banks in this case would satisfy a system data rate of 72 MHz. To satisfy the data rate requirement of 12 MHz, cost saving can be achieved by using a low cost dynamic random access memory (DRAM) instead of the faster and more expensive static RAM (SRAM).

Figure 5:
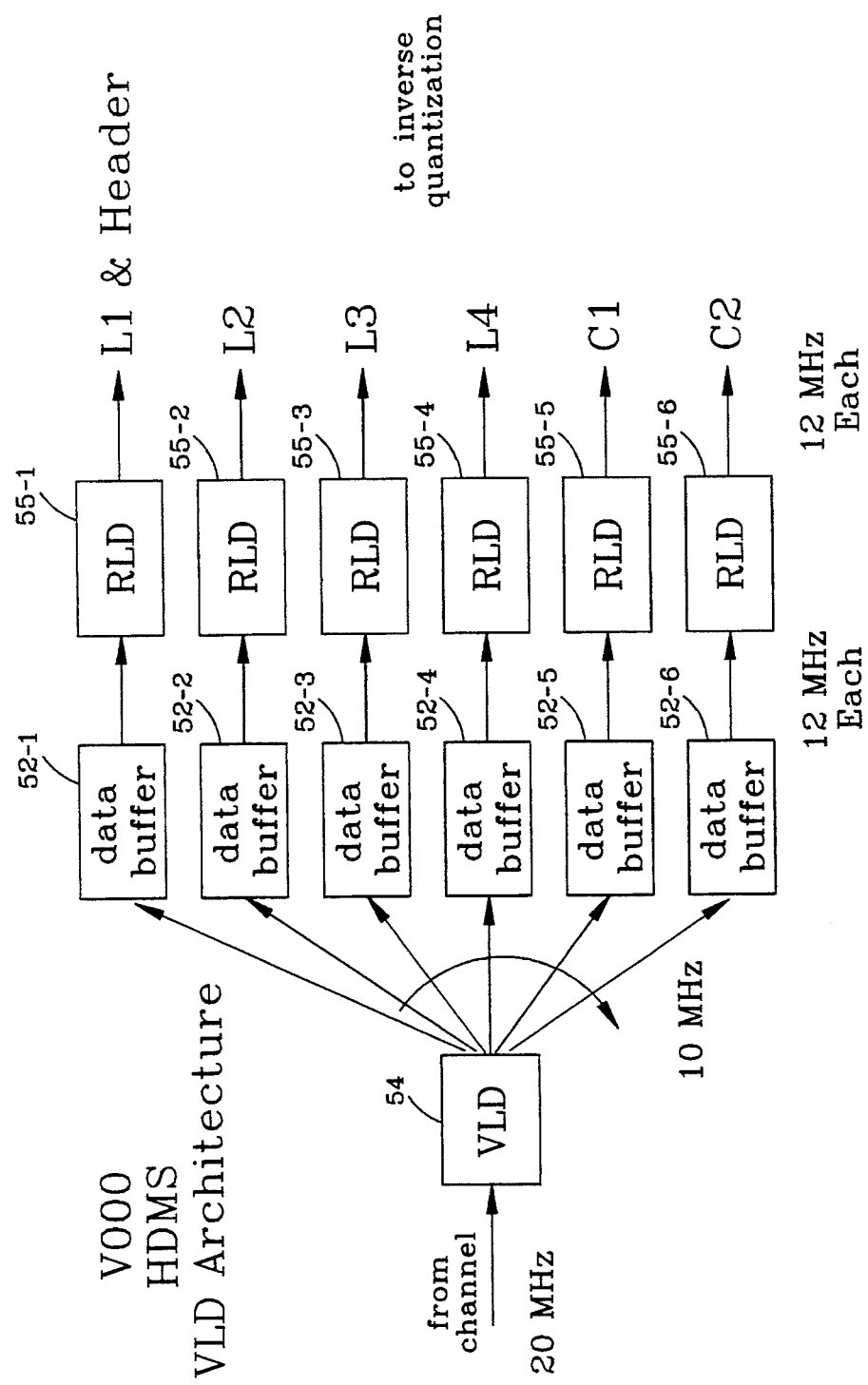
FIG. 5 is a block diagram showing another preferred embodiment of the present invention wherein parallel processing techniques are implemented for the data buffer and the RLD in a digital HDTV system.

FIG. 5 shows another preferred embodiment where the data buffer 52 is divided into a plurality of fix-length data banks 52-1, 52-2, and 52-3 and each of the fix-length data banks is then connected to corresponding run-length decoder (RLD) 56-1, 56-2, and 56-3. Since the output data from the RLD 56 are to be further processed by the inverse quantization units and then inverse IDCT transformed, the output data rate has to be synchronized with the system clock which is approximately 70 MHz. Again, the data processing rate of the RLDs according to the present invention can be reduced because each of the RLDs can independently perform the process in parallel. Therefore, by performing the variable-length decoding directly to the incoming encoded video data, a plurality of fix-length data are generated by the VLD. The rate of the subsequent processes including the storage in the FIFO buffer and the run-length decoding can be greatly reduced because these fix-length data can be easily segmented for distributed processing in parallel.

A system through-put of 70 MHz is therefore achieved by simply rearranging the sequence of operations between the variable-length decoding and the FIFO buffer 52. The basic principle of the present invention is based on the fact that the through-put of the system is not affected by the lower processing rate of the variable-length decoding because of the following reasons. Even that the required through-put of the run-length decoder 56 is 70 MHz, however, due to the fact that the values of the majority of the DCT coefficients are zeros, most of the time the process performed by the run-length decoder 56 is just to repeatedly ship zeros. For that reason, the FIFO buffer 52 is placed between VLD 54 and RLD 56 in the present invention such that the processing rate of VLD 54 is no longer directly related to the processing rate of RLD 56. Through the process of VLD 54, the variable-length words are decoded into fLx-length words. The input data rate to VLD 54 is about twenty million bits per seconds while the output through-put of VLD 54 is about five million words per second which represents a data expansion of about two to three times. By adding many zeros to the data, a data expansion of more than ten times is resulted through the process of RLD 56. Unlike the prior art where VLD 54 is driven directly by RLD 56 which demands VLD 54 to perform at a high through-put rate of 70 MHz only occasionally while remaining idle for the rest of the time, in the present invention, VLD 54 is not driven directly by RLD 56, the process of variable-length decoding can be continuously performed at a much slower rate without affecting the total system through-put. A data rate of 20 million bits per second is received while a pixel rate of 70 million pixels per second is generated. The present invention takes advantage of one essential characteristics of the decompression and that is, on the average, every bit of incoming signal data is used to generate more than three pixels through the decoding process. The difficulty of a low system through-put due to the limitation of a variable-length decoder as encountered in the prior art is therefore resolved by the present invention.

The architecture as disclosed in the present invention is applicable not only to the digital HDTV systems, it can also be utilized in any decoding system which involves decoding the data encoded with various types of variable-length code (VLC) and run-length code (RLC). Many types of multi-media application involving the process of compressed video, audio, and numerical data can all be decoded by use of the decoding system according to the present invention.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A receiver arrangement of a digital communication system for receiving a plurality of variable length code words in the form of serial bit-stream comprising:
   a variable length decoder (VLD) for directly receiving said serial bit-stream and for sequentially decoding each of said plurality of variable length code words into fixed-length data;
   a data storage means including a plurality of data banks for sequentially receiving and temporarily storing said fixed-length data therein;
   a digital communication processing means including a plurality of parallel processing means, each connecting to a corresponding data bank, wherein each of said data banks connected in parallel between said variable length decoder (VLD) and said digital communication processing means via said parallel processing means; and
   each of said plurality of parallel processing means processing in parallel said fixed-length data for generating a plurality of digital communication data at a higher rate than the speed of said sequential decoding performed by said variable length decoder (VLD) to perform a real-time communication function.

2. A high definition television (HDTV) receiver arrangement for receiving and processing a plurality of video data in variable length code words for display comprising:
   a variable-length decoder (VLD) for directly receiving said video data in serial bit-stream and for sequentially decoding each of said plurality of variable length code words into a fixed length data;
   a data storage means for sequentially receiving and temporarily storing said fixed-length data therein and said data storage means further including a plurality of data banks;
   a video-display data processing means for utilizing said fixed-length data from said data storage means for processing and generating a plurality of video display data;
   said video-display data processing means further includes a plurality parallel run-length decoding processing means for performing run-length decoding on said fixed-length data, each connecting to a corresponding data bank, wherein each of said data banks connected in parallel between said variable length decoder (VLD) and said video-display data processing means via said parallel run-length decoding processing means; and
   said video-display data processing means processing said fixed-length data for generating said plurality of video-display data at a rate which is higher than the speed of said sequential decoding performed by said variable length decoder (VLD) to perform a real-time video-display function.

3. The high definition television (HDTV) receiver arrangement of claim 2 wherein:
   said variable length decoder receives said video data in serial bit-stream at a rate of approximately 20 MHz and generating said fixed-length data at a burst rate of approximately 10 Mhz; and
   said data storage means including six data banks and said video-display data processing means including six parallel run-length decoding processing means wherein each of said plurality data banks and parallel run-length decoding processing means has a burst system speed of approximately 12 MHz and said video-display data processing means have a constant system speed of approximately 70 Mhz.

4. The high definition television (HDTV) receiver arrangement of claim 3 wherein:
   said data banks of said data storage means include dynamic random access memory (DRAM) storage means.

5. The high definition television (HDTV) receiver arrangement of claim 2 wherein:
   said variable-length decoder (VLD) sequentially decoding each of said plurality of variable length code words into a fixed length data by utilizing a Huffman decode table.

6. A high definition television (HDTV) receiver arrangement for receiving and processing a plurality of video data in variable length code words for display comprising:
   a variable-length decoder (VLD) for directly receiving said video data in serial bit-stream and for sequentially decoding each of said plurality of variable length code words into a fixed length data by utilizing a Huffman decoding table wherein said variable length decoder receives said video data in serial bit-stream at a rate of approximately 20 MHz and generating said fixed-length data at a burst rate of approximately 10 Mhz;
   a data storage means for sequentially receiving and temporarily storing said fixed-length data therein and said data storage means further including six DRAM data banks;
   a video-display data processing means for utilizing said fixed-length data from said data storage means for processing and generating a plurality of video display data;
   said video-display data processing means further includes six parallel run-length decoding processing means for performing run-length decoding on said fixed-length data, each connecting to a corresponding data bank wherein each of said data banks connected in parallel between said variable length decoder (VLD) and said video-display data processing means via said parallel run-length decoding processing means;
   each of said plurality data banks and parallel run-length decoding processing means has a burst system speed of approximately 12 MHz; and
   said video-display data processing means processing said fixed-length data for generating said plurality of video-display data at a rate of approximately 70 MHz to perform a real-time video-display function.

* * * * *